United States Patent
Ji et al.

(10) Patent No.: US 9,379,249 B2
(45) Date of Patent: Jun. 28, 2016

(54) THIN-FILM TRANSISTOR, METHOD FOR MANUFACTURING THE SAME AND DISPLAY DEVICE COMPRISING THE SAME

(71) Applicant: LG Display Co., Ltd., Seoul (KR)

(72) Inventors: KwangHwan Ji, Taebaek-si (KR); DaeHwan Kim, Paju-si (KR); JunHyeon Bae, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/219,385

(22) Filed: Mar. 19, 2014

(65) Prior Publication Data

US 2014/0291669 A1 Oct. 2, 2014

(30) Foreign Application Priority Data

Mar. 29, 2013 (KR) .......................... 10-2013-0034761
Dec. 30, 2013 (KR) .......................... 10-2013-0167911

(51) Int. Cl.
*H01L 29/786* (2006.01)
*H01L 27/12* (2006.01)
*H01L 29/66* (2006.01)

(52) U.S. Cl.
CPC ........ *H01L 29/7869* (2013.01); *H01L 27/1225* (2013.01); *H01L 29/66969* (2013.01); *H01L 29/78696* (2013.01)

(58) Field of Classification Search
CPC ......... H01L 21/02; H01L 21/12; H01L 21/70; H01L 29/66; H01L 29/786; H01L 51/0508; H01L 2924/13069; H01L 27/1052; H01L 21/8232; H01L 21/84; H01L 29/42384

USPC ........... 257/10, 11, 13, 19, 37, 43, 49–52, 71, 257/98–100, 190, 79–83, 290, 613–615, 257/E51.022, E31.105; 338/227; 438/99, 438/104, 149, 488, 911
See application file for complete search history.

(56) References Cited

U.S. PATENT DOCUMENTS

| | | |
|---|---|---|
| 2009/0315026 A1 | 12/2009 | Jeong et al. |
| 2010/0244022 A1 | 9/2010 | Takahashi et al. |
| 2011/0133181 A1 | 6/2011 | Yamazaki |
| 2012/0061652 A1* | 3/2012 | Sugisawa et al. ............... 257/40 |
| 2012/0228607 A1 | 9/2012 | Miyairi et al. |
| 2012/0300151 A1* | 11/2012 | Yamazaki et al. .............. 349/43 |

(Continued)

OTHER PUBLICATIONS

PCT International Search Report for PCT/KR2014/000812, May 29, 2014, 3 Pages.

*Primary Examiner* — Daniel Whalen
*Assistant Examiner* — Suberr Chi
(74) *Attorney, Agent, or Firm* — Fenwick & West LLP

(57) ABSTRACT

A thin-film transistor includes a substrate, a first gate electrode formed on the substrate, a first active layer that is formed on the substrate and includes a first oxide semiconductor layer and a first barrier layer, a second active layer that is formed on the first active layer and includes a second oxide semiconductor layer and an intermediate barrier layer, a gate insulating layer that is formed on the second active layer, a second gate electrode that is formed on the gate insulating layer and is electrically connected to the first gate electrode, an interlayer insulating film formed on the second gate electrode, the first active layer and the second active layer, and a source electrode and a drain electrode electrically connected to the first active layer and the second active layer.

20 Claims, 13 Drawing Sheets

(56) References Cited

U.S. PATENT DOCUMENTS

| | | |
|---|---|---|
| 2012/0313093 A1 | 12/2012 | Kim et al. |
| 2013/0009219 A1* | 1/2013 | Yamazaki et al. ............ 257/288 |
| 2013/0015438 A1* | 1/2013 | Yamazaki ....................... 257/43 |
| 2013/0037795 A1* | 2/2013 | Sunamura et al. .............. 257/43 |

* cited by examiner

THIN-FILM TRANSISTOR, METHOD FOR MANUFACTURING THE SAME AND DISPLAY DEVICE COMPRISING THE SAME

CROSS-REFERENCE TO RELATED APPLICATIONS

This application claims priority to Korean Patent Application No. 10-2013-0034761 filed on Mar. 29, 2013 and Korean Patent Application No. 10-2013-0167911 filed on Dec. 30, 2013 in the Korean Intellectual Property Office, the disclosure of which is incorporated herein by reference.

BACKGROUND OF THE INVENTION

1. Field of the Invention

The present invention relates to an oxide semiconductor based thin-film transistor and a method for manufacturing the same, and more particularly to an oxide semiconductor based thin-film transistor with an intermediate barrier layer for improving reliability of the thin-film transistor.

2. Description of the Related Art

Recently, with growing interest in information displays and an increasing demand for portable electronic devices, light and thin-film type flat panel display (FPD) devices have been widely studied and commercialized. In particular, among the flat panel displays, liquid crystal display (LCD) devices and organic light-emitting display (OLED) devices have been widely studied, and a thin-film transistor (TFT) has been used as a switching element and/or a driving element in the LCD device and the OLED device.

The thin-film transistor is classified into a thin-film transistor using amorphous-silicon, a thin-film transistor using poly-silicon and a thin-film transistor using an oxide semiconductor according to materials used as an active layer. When the thin-film transistor using poly-silicon is manufactured, a process for implanting ions to adjust resistance of the active layer is further performed, and an ion implantation process using an additional mask for defining an ion implantation region is further performed. For this reason, there is a disadvantage in process. The thin-film transistor using an oxide semiconductor has higher mobility than that of the thin-film transistor using amorphous-silicon semiconductor. Further, the thin-film transistor with an oxide semiconductor generally exhibit lower leakage current than the thin-film transistor with amorphous-silicon semiconductor and poly-silicon semiconductor, and reliability of the thin-film transistor using an oxide semiconductor is relatively higher than those of the thin-film transistor using amorphous silicon and the thin-film transistor using poly-silicon. Furthermore, the thin-film transistor using an oxide semiconductor has an advantage in that uniform distribution characteristics of a threshold voltage are obtained as compared to the thin-film transistor using poly-silicon.

During the operation of the oxide semiconductor based TFT, carriers have a tendency to be accumulated in the insulation layer and to remain "trapped" in the insulation layer throughout the operation of the TFT. Some of the trapped carriers remain in the insulation layer even after the TFT is turned off. In most instances, once carriers are trapped, they remain trapped throughout the on and off states of the TFT, possibly for the entire life of the TFT. This "trapping" of carriers causes the threshold voltage to gradually shift, and the amount of threshold shift is generally correlated to the amount of deep trap density.

SUMMARY OF THE INVENTION

Embodiments relate to a thin-film transistor (TFT) including a first oxide semiconductor layer and a second oxide semiconductor layer, an intermediate barrier separating the first and second oxide semiconductor layers. A first gate insulating layer is disposed on a first gate electrode. The first and second oxide semiconductor layers are disposed on the first gate insulation film. A second gate insulating layer is disposed on the second oxide semiconductor layer. A second gate electrode is disposed on the second gate insulating layer. The second gate electrode is electrically connected to the first gate electrode. A source electrode is electrically connected to the first and second oxide semiconductor layers. A drain electrode is electrically connected to the first and second oxide semiconductor layers.

In one embodiment, a first current path is induced in the first oxide semiconductor layer by applying a first voltage to the first gate electrode and a second current path is induced in the second oxide semiconductor layer by applying a second voltage to the second gate electrode.

In one embodiment, the TFT is configured to receive the first and second voltages simultaneously. Also, in one embodiment, the first and second voltage s may be identical to each other.

In one embodiment, the TFT is an N-type TFT, and the intermediate barrier layer includes a barrier material having a maximum valance band value ($V_{max}$) lower than the material of at least one of the first and second oxide semiconductor layers. In one embodiment, the TFT is a P-type TFT, and the intermediate barrier layer includes a barrier material having a maximum conduction band value ($C_{max}$) greater than the material of at least one of the first and second oxide semiconductor layers.

In one embodiment, the first oxide semiconductor layer has a cross-sectional width equal to or greater than that of the second oxide semiconductor layer, and the source and drain electrodes are in direct contact with the first and second oxide semiconductor layers.

In one embodiment, a first barrier layer is interposed between the first gate insulating layer and the first oxide semiconductor layer. A second barrier layer is interposed between the second gate insulating layer and the second oxide semiconductor layer.

In one embodiment, the TFT is an N-Type TFT, and the first barrier layer includes a barrier material having a maximum valance band value ($V_{max}$) lower than that of at least one of the first oxide semiconductor layer and the first gate insulating layer. In one embodiment, the TFT is a P-Type TFT, and the first barrier layer includes a barrier material having a maximum conduction band value ($C_{max}$) greater than that of at least one of first oxide semiconductor layer and the first gate insulating layer.

In one embodiment, the TFT is an N-Type TFT, and the second barrier layer includes a barrier material having a maximum valance band value ($V_{max}$) lower than that of at least one of the second oxide semiconductor layer and the second gate insulating layer. In one embodiment, the TFT is an P-Type TFT, and the second barrier layer includes a barrier material having a maximum conduction band value ($C_{max}$) greater than that of at least one of the second oxide semiconductor layer and the second gate insulating layer.

In one embodiment, the first gate electrode is made of a reflective conductive material.

In one embodiment, the TFT is an N-Type TFT, and the intermediate barrier layer includes at least one of TiOx, TaOx, $SrTiO_3$, $BaZrO_3$, $ZrO_2$, $HfO_2$, $Al_2O_3$, MgO and $Ga_2O_3$. In one embodiment, the TFT is a P-Type TFT, and the intermediate barrier layer includes at least one of $Cu_2O$, $CuAlO_2$, $SiO_2$, $SrCu_2O_2$ and $Al_2O_3$.

Embodiments also relate to a thin-film transistor (TFT) including a first barrier layer interposed between an oxide semiconductor layer and a first gate insulating layer. In one embodiment, the TFT is an N-Type TFT, and the first barrier layer includes a barrier material having a maximum valance band value ($V_{max}$) lower than that of at least one of the first oxide semiconductor layer and the first gate insulating layer. In one embodiment, the TFT is a P-Type TFT, and the first barrier layer includes a barrier material having a maximum conduction band value ($C_{max}$) greater than that of at least one of first oxide semiconductor layer and the first gate insulating layer.

The TFT may further include a second barrier layer interposed between the oxide semiconductor layer and a second gate insulating layer. In one embodiment, the TFT is an N-Type TFT, and the second barrier layer comprises a second material having a maximum valance band value ($V_{max}$) lower than that of the oxide semiconductor layer and the second gate insulating layer. In one embodiment, the TFT is a P-Type TFT, and the second barrier layer comprises a second material having a maximum conduction band value ($C_{max}$) greater than that of the oxide semiconductor layer and the second gate insulating layer.

In one embodiment, the oxide semiconductor layer includes indium (In), gallium (Ga) and Zinc (Zn).

Embodiments also relate to a method for manufacturing a thin-film transistor (TFT). A first gate electrode is formed on a substrate. A first gate insulating layer is formed on the first gate electrode. An oxide semiconductor layer and a barrier layer are formed on the first gate insulating layer.

In one embodiment, the barrier layer is formed between the first gate insulating layer and the oxide semiconductor layer. When the TFT is an N-Type TFT, the barrier layer includes a barrier material having a maximum valance band value ($V_{max}$) lower than that of the oxide semiconductor layer and the first gate insulating layer. When the TFT is a P-Type TFT, the barrier layer includes a barrier material having a maximum conduction band value ($C_{max}$) greater than that of the oxide semiconductor layer and the first gate insulating layer.

In one embodiment, a second gate insulating layer and a second gate electrode are formed on the oxide semiconductor layer such that the second gate insulating layer is formed between the oxide semiconductor layer and the second gate electrode. The barrier layer is formed between the second gate insulating layer and the oxide semiconductor layer. When the TFT is an N-Type TFT, the barrier layer includes a barrier material having a maximum valance band value ($V_{max}$) lower than that of the oxide semiconductor layer and the first gate insulating layer. When the TFT is a P-Type TFT, the barrier layer includes a barrier material having a maximum conduction band value ($C_{max}$) greater than that of the oxide semiconductor layer and the first gate insulating layer.

In one embodiment, the barrier layer is formed between the first gate insulating layer and the oxide semiconductor layer, and another barrier layer is formed between the second gate insulating layer and the oxide semiconductor layer.

In one embodiment, the oxide semiconductor layer is formed of a first oxide semiconductor layer and a second oxide semiconductor layer, and the barrier layer is formed between the first and second oxide semiconductor layers. When the TFT is an N-Type TFT, the barrier layer includes a barrier material having a maximum valance band value ($V_{max}$) lower than that of the first and second oxide semiconductor layers. When the TFT is a P-Type TFT, the barrier layer includes a barrier material having a maximum conduction band value ($C_{max}$) greater than that of the first and second oxide semiconductor layers.

In one embodiment, the barrier layer is formed between the first gate insulating layer and the first oxide semiconductor layer. Another barrier layer is formed on the first oxide semiconductor layer, and a second oxide semiconductor layer is formed on the other barrier layer. Yet another barrier layer is formed on the second oxide semiconductor layer, and then a second gate insulating layer is formed on the second oxide semiconductor. A second gate electrode is formed on the second gate insulating layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
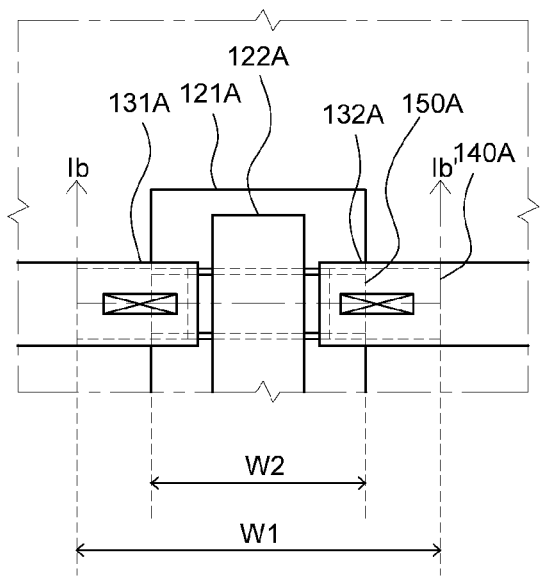
FIG. 1A is a plan view for describing a thin-film transistor according to an exemplary embodiment of the present invention.

Various advantages and features of the present invention and methods accomplishing thereof will become apparent from the following description of embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Indicating that elements or layers are "on" other elements or layers include both a case in which the corresponding elements are just above other elements and a case in which the corresponding elements are intervened with other layers or elements.

Although first, second, and the like are used in order to describe various components, the components are not limited by the terms. The above terms are used only to discriminate one component from the other component. Therefore, a first component mentioned below may be a second component within the technical spirit of the present invention.

The same reference numerals indicate the same elements throughout the specification.

In the drawings, size and thickness of each element are arbitrarily illustrated for convenience of description, and the present invention is not necessarily limited to those illustrated in the drawings.

In this specification, a flexible display device means an organic light emitting display device to which flexibility is granted, and may be used as the same meaning as a bendable display device, a rollable display device, an unbreakable display device, a foldable display device, and the like. In this specification, the flexible organic light emitting display device is one example of various flexible display devices.

In this specification, a transparent display device means a display device in which at least a partial area in a screen of the display device viewed by a viewer is transparent. In this specification, the transparent display device means a display device which is transparent in which transparency of the transparent display device is at least a level a display device which is transparent for a user to recognize an object behind the display device. The transparent display device in the present specification includes a display region and a non-display region. The display region is a region where a video or the like is displayed, and the non-display region is a region, such as bezel, where the video is not displayed. In order to maximize transmittance of the display region, in the transparent display device, non-transparent elements such as a battery, a PCB (Printed Circuit Board), and a metal frame are arranged not under the display region but under the non-display region. In this specification, the transparent display device means, for example, a display device in which transmittance of the transparent display device is at least 20% or more. The transmittance in the present specification means a value obtained by dividing the amount of light transmitted through the transparent display device by the total amount of entered light except for light which has entered a transmitting region of the transparent display device and has been reflected from an interface of the respective layers of the transparent display device.

A front surface and a rear surface of the transparent display device in the present specification are defined in view of light emitted from the transparent display device. In the present specification, the front surface of the transparent display device means a surface on which light is emitted from the transparent display device, and the rear surface of the transparent display device means a surface opposite to the surface on which light is emitted from the transparent display device.

Respective features of various exemplary embodiments of the present invention can be partially or totally joined or combined with each other and as sufficiently appreciated by those skilled in the art, various interworking or driving can be technologically achieved and the respective exemplary embodiments may be executed independently from each other or together executed through an association relationship.

Hereinafter, exemplary embodiments of the present invention will be described with reference to the accompanying drawings.

Oxide semiconductors are becoming more popular for use as active layers in TFT due to its high mobility and other beneficial characteristics. However, the oxide semiconductors are susceptible to degradation by exposure to light and other factors such as the fabrication process of the TFT. The threshold voltage of the TFT may change as the result of the fabrication process or, even worse, change over time and operations of the TFT as the TFT is exposed to light. It is desirable that the threshold voltage of the TFT remains constant to provide a consistent operation of the TFT. Embodiments relate to providing one or more barrier layers to prevent degradation of the oxide semiconductors in the TFT as a result of the fabrication process and/or exposure to the light.

Figure 1B:
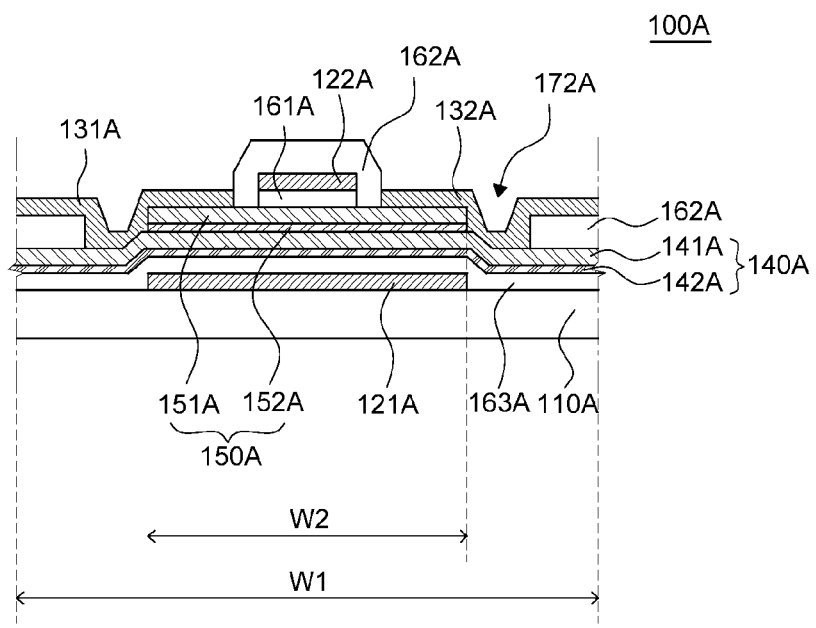
FIG. 1B is a cross-sectional view of the thin-film transistor taken along line Ib-Ib' of FIG. 1A.

FIG. 1A is a plan view for describing a thin-film transistor according to an exemplary embodiment of the present invention. FIG. 1B is a cross-sectional view of the thin-film transistor taken along line Ib-Ib' of FIG. 1A. Referring to FIGS. 1A and 1B, a thin-film transistor 100A includes a substrate 110A, a first gate insulating layer 163A, a first gate electrode 121A, a first active layer 140A, a second active layer 150A, a second gate insulating layer 161A, a second gate electrode 122A, an interlayer insulating film 162A, a source electrode 131A, and a drain electrode 132A.

The substrate 110A is a member for supporting various elements that can be formed on the substrate 110A. The substrate 110A may be made from an insulating material such as glass or plastic, but is not limited thereto. The substrate may be made from various materials.

The substrate 110A may be made from various materials depending on various applications in which the thin-film transistor 100A is used. For example, when the thin-film transistor 100A is used in a flexible display device, the substrate 110A may be made from a flexible insulating material. Here, examples of the flexible insulating material include polyimide (PI), polyetherimide (PEI), polyethyelene terephthalate (PET), polycarbonate (PC), polystyrene (PS), styrene-acrylonitrile copolymer (SAN), and silicone-acrylic resin. Further, when the thin-film transistor 100A is used in a transparent display device, the substrate 110A may be made from a transparent insulating material. Although it has been described that the thin-film transistor 100A includes the substrate 110A, the substrate 110A may be discrete element separate from the thin-film transistor 100A. In such cases, the substrate is an independent element separated from the thin-film transistor serving as a base for supporting the elements included in the thin-film transistor.

The first gate electrode 121A as a lower gate electrode is formed on the substrate 110A. The first gate electrode 121A transmits a driving signal to the thin-film transistor 100A. The first gate electrode 121A is overlapped with the first active layer 140A, specifically, a first oxide semiconductor layer 141A of the first active layer 140A.

The first gate electrode 121A may be made from a conductive metal material. The first gate electrode 121A may be made from any one of, for example, molybdenum (Mo), aluminum (Al), chrome (Cr), gold (Au), titanium (Ti), nickel (Ni), neodymium (Nd) and copper (Cu), or an alloy thereof, but is not limited thereto. The first gate electrode 121A may be made from various materials. Moreover, the first gate electrode 121A may be multiple layers made from any one selected from a group consisting of molybdenum (Mo), aluminum (Al), chrome (Cr), gold (Au), titanium (Ti), nickel (Ni), neodymium (Nd) and copper (Cu), or an alloy thereof.

The first gate insulating layer 163A is formed on the substrate 110A. The first gate insulating layer 163A is formed to cover the first gate electrode 121A on the substrate 110A. The first gate insulating layer 163A prevents moisture or other impurities from permeating through the substrate 110A. The first gate insulating layer 163A is made from an insulating film. A material constituting the first gate insulating layer 163A may be selected depending on a kind of the substrate 110A or a kind of the thin-film transistor 100A. For example, the first gate insulating layer 163A may be a silicon oxide film, a silicon nitride film, or multiple layers including the silicon oxide film and the silicon nitride film.

The first active layer 140A, as a lower active layer, is formed on the first gate insulating layer 163A. The first active layer 140A is formed above the first gate electrode 121A to serve as the lower active layer of the thin-film transistor 100A and provides a conductive channel (path) at a lower side of the TFT (hereinafter referred to as "the lower channel"). The first active layer 140A includes a first oxide semiconductor layer 141A that is formed above the first gate insulating layer 163A to provide the lower channel and a first barrier layer 142A that is formed between the first gate insulating layer 163A and the first oxide semiconductor layer 141A to reduce degradation of the thin-film transistor 100A by light.

The first oxide semiconductor layer 141A is formed on the first barrier layer 142A. The first oxide semiconductor layer 141A is formed to have substantially the same area as that of the first barrier layer 142A on the first barrier layer 142A. More specifically, the first oxide semiconductor layer 141A and the first barrier layer 142A are positioned to overlap with each other. In some other embodiments, however, the first oxide semiconductor layer 141A and the first barrier layer 142 may be offset in horizontal locations and may have different horizontal dimensions.

The first oxide semiconductor layer 141A may be made from various metal oxides. Examples of a constituent material of the first oxide semiconductor layer 141A includes a quaternary metal oxide such as an indium-tin-gallium-zinc-oxide (In—Sn—Ga—Zn—O)-based material, a ternary metal oxide such as an indium-gallium-zinc-oxide (In—Ga—Zn—O)-based material, an indium-tin-zinc-oxide (In—Sn—Zn—O)-based material, an indium-aluminum-zinc-oxide (In—Al—Zn—O)-based material, an indium-hafnium-zinc-oxide (In—Hf—Zn—O)-based material, a tin-gallium-zinc-oxide (Sn—Ga—Zn—O)-based material, an aluminum-gallium-zinc-oxide (Al—Ga—Zn—O-based material) and a tin-aluminum-zinc-oxide (Sn—Al—Zn—O)-based material, and a binary metal oxide such as an indium-zinc-oxide (In—Zn—O)-based material, a tin-aluminum-zinc-oxide (Sn—Zn—O)-based material, an aluminum-zinc-oxide (Al—Zn—O)-based material, a zinc-magnesium-oxide (Zn—Mg—O)-based material, a tin-magnesium-oxide (Sn—Mg—O)-based material, an indium-magnesium-oxide (In—Mg—O)-based material, an indium-gallium-oxide (In—Ga—O)-based material, an indium-oxide (In—O)-based material, a tin-oxide (Sn—O)-based material and a zinc-oxide (Zn—O)-based material. Composition ratios of the elements included in the respective oxide semiconductor materials are not particularly limited, and may be adjusted at various composition ratios.

The first oxide semiconductor layer 141A overlaps with the first gate electrode 121A, comes in contact with the source electrode 131A and the drain electrode 132A, and provides the lower channel when a gate voltage is applied to the first gate electrode 121A. The first barrier layer 142A is formed between the first gate insulating layer 163A and the first oxide semiconductor layer 141A. The first barrier layer 142A is a layer for reducing the degradation of the thin-film transistor 100A by light, and specifically, is a layer for suppressing hole conduction between the first gate insulating layer 163A and the first oxide semiconductor layer 141A. The first barrier layer 142A will be explained in more detail with reference to FIG. 1C.

Figure 1C:
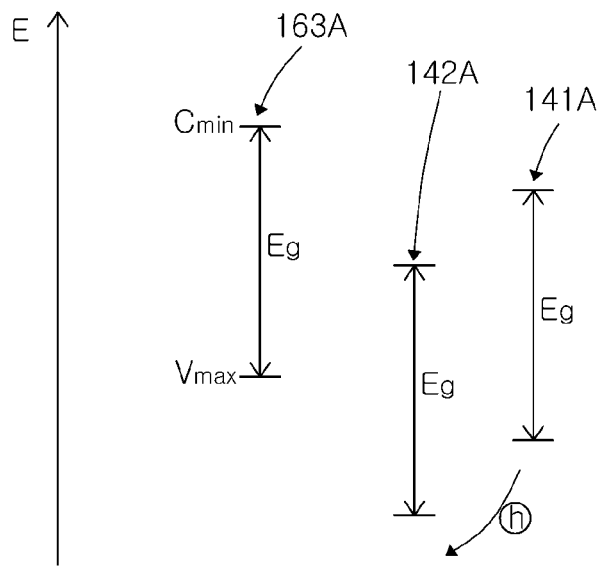
FIGS. 1C and 1D are energy band diagrams for describing the function of intermediate barrier layer of the thin-film transistor according to the exemplary embodiment of the present invention.

FIG. 1C is an energy band diagram for describing the thin-film transistor according to the exemplary embodiment of the present invention. For the sake of convenience in description, in FIG. 1C, only the first gate insulating layer 163A, the first barrier layer 142A and the first oxide semiconductor layer 141A of the thin-film transistor 100A are illustrated. Moreover, FIG. 1C illustrates a case the thin-film transistor is an n-type transistor as an example.

The first barrier layer 142A is the layer for reducing the degradation of the thin-film transistor 100A by light and serves as a charge trapping barrier for reducing the degradation of the thin-film transistor 100A due to exposure to light. The first barrier layer 142A is formed of a material having a maximum valence band value, which is lower than that of the material forming the first gate insulating layer 163A. The function of the first barrier layer 142A in terms of an energy band gap, a valence band and a conduction band is described herein with reference to FIGS. 1C and 1D.

The valence band is an energy band that is formed by the interaction of orbitals inside atoms, and refers to an energy band within which electrons having continuous energies do not move to other atoms while the electrons are bound to individual atoms. The conduction band is an energy band that is formed by the overlap of orbitals outside atoms, and refers to an energy band in which electrons having continuous energies can freely move from their atoms to other atoms. The electrons positioned within the conduction band are called free electrons. An energy band gap "Eg" means the difference in energy values between the valence band and the conduction band, more specifically, the difference between a maximum energy value "Vmax" of the valence band, which is a relatively lower energy band and a minimum energy value "Cmin" of the conduction band, which is a relatively higher energy band. In general, as an energy band gap of a material is low, the material is a conductor, and as an energy band gap of a material is high, the material is an insulator.

In the n-type thin-film transistor 100A, when light illuminates the first oxide semiconductor layer 141A while the gate voltage is applied to the first gate electrode 121a, hole/electron pairs may be generated in the first oxide semiconductor layer 141A. Holes "h" may be trapped in the first gate insulating layer 163A during the operation of the thin-film transistor, leaving electrons "e" in the first oxide semiconductor layer 141A. Some of the trapped carriers remain in the insulation layer even after the TFT is turned off. Since, the number of electrons generated in the first oxide semiconductor layer 141A depends on the number of the holes "h" at the interface of the first oxide semiconductor layer 141A and the first gate insulating layer 163A, the holes trapped in the first gate insulating layer 163A can gradually shift the threshold voltage Vth of the thin-film transistor.

Accordingly, the first barrier layer 142A is used for reducing shifting of the threshold voltage Vth of the thin-film transistor 100A. Specifically, the first barrier layer 142A has a lower maximum valence band value (Vmax) than the maximum valence band value of the first gate insulating layer 163A that is in contact with the first barrier layer 142A. The maximum valence band value of the first barrier layer 142A is also lower than the maximum valence band value of the first oxide semiconductor layer 141A. As such, the material of the first barrier layer 142A is such that the difference between the maximum valence band value of the first gate insulating layer 163A and the maximum valence band of the first barrier layer 142A is larger than the difference between the maximum valence band value of the first oxide semiconductor layer 141A and the maximum valence band value of the first barrier layer 142A.

With a maximum valence band value that is lower than the maximum valence band value of the first oxide semiconductor layer 141A and the first gate insulating layer 163A, the first barrier layer 142A makes it difficult for the holes generated in the first oxide semiconductor layer 141A to pass through the first barrier layer 142A and reach the first gate insulating layer 163A. This reduces the amount of holes being trapped in the first gate insulating layer 163A, thereby reducing the threshold voltage (Vth) shift of the thin-film transistor 100A.

As described above, the functionality of the first barrier layer 142A depends on the relative difference of the maximum valence band value of the adjacent layers. As such, the material for forming the first barrier layer 142A can vary depending on the material of the first oxide semiconductor layer 141A and the first gate insulating layer 163A in contact with the first barrier layer 142A. In way of an example, the first oxide semiconductor layer 141A may be formed of indium-gallium-zinc oxide (IGZO), and the first gate insulating layer 163A may be formed of silicon nitride. In this example, the first barrier layer 142A may be formed of any one of barium zirconate ($BaZrO_3$), zirconium dioxide ($ZrO_2$), magnesium oxide (MgO), gallium oxide ($Ga_2O_3$), strontium titanate oxide ($SrTiO_3$), tantalum oxide (TaOx), aluminum oxide ($Al_2O_3$), hafnium oxide ($HfO_2$), hafnium silicon oxide ($HfSiO_4$), yttrium oxide ($Y_2O_3$), and titanium oxide (TiOx), and a combination thereof. For example, the first barrier layer 142A formed of TaOx exhibits superior hole blocking ability, making it an excellent barrier material for preventing the hole trapping in the first gate insulating layer 163A.

Figure 1D:
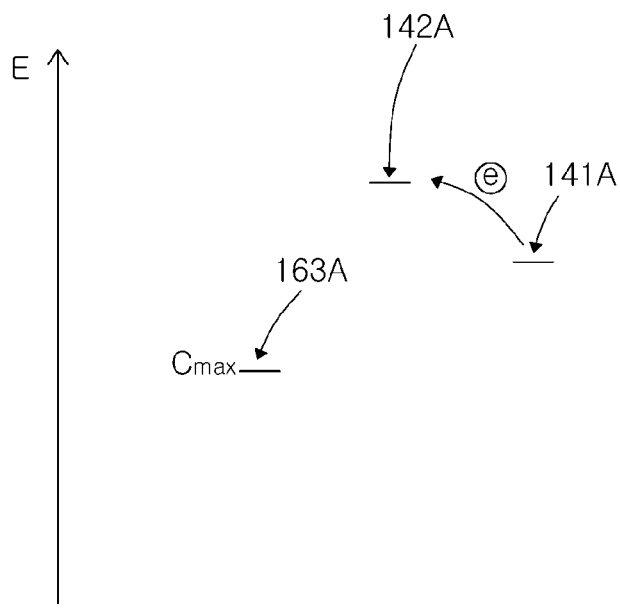

FIG. 1D is an energy band diagram for describing the thin-film transistor according to the exemplary embodiment in which the thin-film transistor is a p-type transistor.

In the p-type thin-film transistor 100A, when light illuminates the first oxide semiconductor layer 141A while the gate voltage is applied to the first gate electrode 121A, electrons may be generated in the first oxide semiconductor layer 141A, and the generated electrons may be trapped in the first gate insulating layer 163A. Holes may be generated in the first oxide semiconductor layer 141A by the number of the trapped electrons, and the threshold voltage of the thin-film transistor 100A may be shifted to cause the deterioration in characteristics of the thin-film transistor 100A.

The first barrier layer 142A is an element for reducing the shifting of the threshold voltage Vth of the thin-film transistor 100A. The constituent material of the first barrier layer 142A is determined such that a difference between the maximum energy value of the conduction band of the material constituting the first gate insulating layer 163A and the maximum energy value of the conduction band of the material constituting the first barrier layer 142A is larger than a difference between the maximum energy value of the conduction band of the material constituting the first oxide semiconductor layer 141A and the maximum energy value of the conduction band of the material constituting the first barrier layer 142A. Specifically, the first barrier layer 142A is made from a material having a maximum energy value of a conduction band which is greater than a maximum energy value of a conduction band of the material constituting the first gate insulating layer 163A coming in contact with the first barrier layer 142A and is greater than a maximum energy value of a conduction band of the material constituting the first oxide semiconductor layer 141A. When the first barrier layer 142A is formed so as to have the aforementioned maximum energy value relation, it is difficult for the electrons to pass through the first barrier layer 142A and be trapped in the first gate insulating layer 163A. As such, the first barrier layer 142A can reduce the deterioration in characteristics of the thin-film transistor 100A that is likely to occur due to the shifted threshold voltage of the thin-film transistor 100A.

Similar to the example of the N-Type TFT, the functionality of the first barrier layer 142A depends on the relative difference of the maximum conduction band value of the adjacent layers, and thus, the material for forming the first barrier layer 142A can vary depending on the material of the first oxide semiconductor layer 141A and the first gate insulating layer 163A in contact with the first barrier layer 142A. In way of an example, the first oxide semiconductor layer 141A may be formed of indium-gallium-zinc oxide (IGZO), and the first gate insulating layer 163A may be formed of silicon nitride. In this example, the first barrier layer 142A may be formed of any one of copper oxide ($Cu_2O$), copper aluminum oxide ($CuAlO_2$), silicon oxide ($SiO_2$), strontium copper oxide ($SrCu_2O_2$), aluminum oxide ($Al_2O_3$) and a combination thereof. For example, the first barrier layer 142A formed of $Cu_2O$ exhibits superior electron blocking ability, making it an excellent barrier material for preventing the electron trapping in the first gate insulating layer 163A of the P-type TFT.

The material for forming the first barrier layer 142A may depend on other factors in addition to the maximum valence band value/maximum conduction band value relationships discussed above. In both the N-type and P-type TFTs, the interface between the surfaces of the first oxide semiconductor layer 141A and the first gate insulating layer 163A may have defects, which allows electrons to be trapped therein during the operation of the thin-film transistor. Reducing the defect density at the interface of the first oxide semiconductor layer 141A and the first gate insulating layer 163A can also increase the overall operation stability of the thin-film transistor. Accordingly, the material for forming the first barrier layer 142A may also depends on the defect density at the interface (which may also depend on the material of the first oxide semiconductor layer 141A and the first gate insulating layer 163A). A material that exhibiting the interface defect density reduction functionality may be used for the first barrier layer 142A even if the material is not the best material for the hole blocking functionality. Further, the first barrier layer 142A may be formed of an alloy that includes a material exhibiting superior hole blocking functionality and a material exhibiting superior interface defect density reducing functionality. Also, the first barrier layer 142A may be formed of a stack of layers, in which at least one of the layers is formed of a material for exhibiting the hole blocking functionality and at least one of the layers is formed of a material for reducing the interface defect density of the adjacent layer (e.g., the first oxide semiconductor layer 141A, the first gate insulating layer 163A).

Referring back to FIGS. 1A and 1B, the second active layer 150A as an upper active layer is formed on the first active layer 140A. The second active layer 150A is formed on the first active layer 140A to serve as the upper active layer of the thin-film transistor 100A and provides a conductive channel at the upper side of the TFT (hereinafter referred to as "the upper channel"). The second active layer 150A includes a second oxide semiconductor layer 151A that is formed on the first active layer 140A to provide the upper channel and an intermediate barrier layer 152A formed between the first oxide semiconductor layer 141A and the second oxide semiconductor layer 151A to reduce the degradation of the thin-film transistor 100A by exposure to light. The second oxide semiconductor layer 151A is overlapped with the second gate electrode 122A is configured to be in contact with the source electrode 131A and the drain electrode 132A, and to provide the upper channel when the gate voltage is applied to the second gate electrode 122A. The second oxide semiconductor layer 151A is formed on the intermediate barrier layer 152A. The second oxide semiconductor layer 151A is formed to have the substantially same area as that of the intermediate barrier layer 152A. The second oxide semiconductor layer 151A may be formed of similar metal oxide material(s) as the first oxide semiconductor layer 141A described above.

The cross-sectional width "W2" of the second active layer 150A is narrower than the cross-sectional width "W1" of the first active layer 140A. The cross-sectional width of the active layer in the present specification means a length of the active layer from the source electrode side end to the drain electrode side end of the active layer. The cross-sectional width "W2" of the second active layer 150A is smaller than the cross-sectional width "W1" of the first active layer 140A such that some part of the first active layer 140A is not covered by the second active layer 150A formed on the first active layer 140A. This allows the first active layer 140A to come in contact with the source electrode 131A and the drain electrode 132A.

The intermediate barrier layer 152A is formed between the first active layer 140A and the second oxide semiconductor layer 151A. The intermediate barrier layer 152A is the layer for reducing the degradation of the thin-film transistor 100A by light and serves as a charge (holes/electrons) trapping barrier for reducing degradation of the thin-film transistor 100A due to exposure to light. The material for forming the intermediate barrier layer 152 may be different depending on the type of the TFT. For N-type TFT, the intermediate barrier layer 152A is made from a material having the maximum valence band value smaller than the maximum valence band values of the materials constituting the first oxide semiconductor layer 141A and the second oxide semiconductor layer 151A. For P-type TFT, the intermediate barrier layer 152A is made from a material having the maximum conduction band value smaller than the maximum conduction band values of the materials constituting the first oxide semiconductor layer 141A and the second oxide semiconductor layer 151A.

In the n-type thin-film transistor 100A, when the light illuminates the first oxide semiconductor layer 141A while the gate voltage is applied to the first gate electrode 121A, holes may be generated in the first oxide semiconductor layer 141A and the second oxide semiconductor layer 151A, and the generated holes may move between the first oxide semiconductor layer 141A and the second oxide semiconductor layer 151A to be trapped in the first gate insulating layer 163A. Electrons may be generated in the first oxide semiconductor layer 141A and the second oxide semiconductor layer 151A by the number of the trapped holes, and the threshold voltage of the thin-film transistor 100A may be shifted to cause the deterioration in characteristics of the thin-film transistor 100A.

As previously explained, the intermediate barrier layer 152A made from a material having the maximum valence band value lower than the maximum valence band values of the materials constituting the first oxide semiconductor layer 141A and the second oxide semiconductor layer 151A makes it difficult for the holes/electrons to move between the first oxide semiconductor layer 141A and the second oxide semiconductor layer 151A through the intermediate barrier layer 152A. More specifically, the intermediate barrier layer 152A serves as a barrier for preventing the holes/electrons in the second oxide semiconductor layer 151A to pass through the intermediate barrier layer 152A and be trapped in the first gate insulating layer 163A. Similarly, the intermediate barrier layer 152A makes it difficult for the holes/electrons in the first oxide semiconductor layer 141A to travel over to the second oxide semiconductor layer 151A and be trapped in the second gate insulating layer 161A. As such, the intermediate barrier layer 152A can reduce the deterioration in characteristics of the thin-film transistor 100A that is likely to occur due to the shifted threshold voltage of the thin-film transistor 100A caused by the charge trapping phenomenon.

The material for forming the intermediate barrier layer 152A is selected depending on the materials forming the first oxide semiconductor layer 141A and the second oxide semiconductor layer 151A. The material for the intermediate barrier layer 152A can be selected by considering the valence band maximum value/conduction band maximum value relationship with the first and second oxide semiconductor layers 141A and 151A. For example, in cases of N-type TFT, the intermediate barrier layer 152A may be made from various oxide materials such barium zirconate ($BaZrO_3$), zirconium dioxide ($ZrO_2$), magnesium oxide (MgO), gallium oxide ($Ga_2O_3$), strontium titanate oxide ($SrTiO_3$), tantalum oxide (TaOx), aluminum oxide ($Al_2O_3$), hafnium oxide ($HfO_2$), hafnium silicon oxide ($HfSiO_4$), yttrium oxide ($Y_2O_3$), and titanium oxide (TiOx), and a combination thereof. Unlike the first barrier layer 142A discussed above, the interface defect density between the oxide semiconductor layers and the gate insulating layers needs not be considered because the intermediate barrier layer 152A is interposed between the first and second oxide semiconductor layers 141A and 151A. As such, it is preferred that the intermediate barrier layer 152A is formed of TaOx, and more preferably $Ta_2O_5$. In case of a P-type TFT, the intermediate barrier layer 152A may be formed of any one of copper oxide ($Cu_2O$), copper aluminum oxide ($CuAlO_2$), silicon oxide ($SiO_2$), strontium copper oxide ($SrCu_2O_2$), aluminum oxide ($Al_2O_3$) and a combination thereof.

The second gate insulating layer 161A is formed on the second active layer 150A. The second gate insulating layer 161A insulates the second active layer 150A from the second gate electrode 122A. The second gate insulating layer 161A may be the silicon oxide film, the silicon nitride film, or the stack of multiple layers including the silicon oxide film and the silicon nitride film, but is not limited thereto. The second gate insulating layer 161A may be made from various materials. The second gate insulating layer 161A may be formed over the entire surface of the substrate 110A including the second active layer 150A. However, since the second gate insulating layer 161A has only to insulate the second active layer 150A from the gate electrode, the second gate insulting film 161A may be formed only on the second active layer 150A as shown in FIG. 1B.

The second gate electrode 122A as an upper gate electrode is formed on the second gate insulating layer 161A. The second gate electrode 122A transmits a driving signal to the thin-film transistor 100A. The second gate electrode 122A is overlapped with the second active layer 150A, specifically, the second oxide semiconductor layer 151A of the second active layer 150A.

The second gate electrode 122A is made from a conductive material. The second gate electrode 122A may be made from the same material as that of the first gate electrode 121A, but is not limited thereto. The second gate electrode may be made from various materials. The first gate electrode 121A and the second gate electrode 122A are electrically connected to each other. The second gate electrode 122A is formed above the first gate electrode 121A, and the first gate electrode 121A and the second gate electrode 122A may directly come in contact with each other or may indirectly come in contact with each other through a separate conductive material. Accordingly, the same gate voltage is applied to the first gate electrode 121A and the second gate electrode 122A.

The interlayer insulating film 162A is formed on the second gate electrode 122A. The interlayer insulating film 162A may be made from the same material as that of the second gate insulating layer 161A, but is not limited thereto. The interlayer insulating film may be made from various materials. In one embodiment, the interlayer insulating film 162A may be formed over the entire surface of the substrate 110A, and may be formed to have contact holes 172A for opening partial regions of the first active layer 140A and the second active layer 150A.

The source electrode 131A and the drain electrode 132A are formed on the interlayer insulating film 162A. The source electrode 131A and the drain electrode 132A are electrically connected to the first active layer 140A and the second active layer 150A, respectively, through the contact holes 172A formed at the interlayer insulating film 162A and/or the second gate insulating layer 161A. The source electrode 131A and the drain electrode 132A are made from conductive materials. The source electrode 131A and the drain electrode 132A any one of, for example, molybdenum (Mo), aluminum (Al), chrome (Cr), gold (Au), titanium (Ti), nickel (Ni), neodymium (Nd) and copper (Cu), or an alloy thereof, but is not limited thereto. The source electrode and the drain electrode may be made from various materials. Moreover, the source electrode 131A and the drain electrode 132A may be multiple layers made from any one selected from a group consisting of molybdenum (Mo), aluminum (Al), chrome (Cr), gold (Au), titanium (Ti), nickel (Ni), neodymium (Nd) and copper (Cu), or an alloy thereof.

The source electrode 131A and the drain electrode 132A come in contact with at least one of a top portion and a side portion of the second active layer 150A and at least one of a top portion and a side portion of the first active layer 140A. As stated above, since the width of the second active layer 150A is narrower than the width of the first active layer 140A, even though the second active layer 150A is formed on the first active layer 140A, the partial region of the first active layer 140A is not covered by the second active layer 150A. Accordingly, as shown in FIG. 1B, the source electrode 131A and the drain electrode 132A come in contact with the top portion of the first oxide semiconductor layer 141A of the first active layer 140A and the top portion and the side portion of the second oxide semiconductor layer 151A of the second active layer 150A.

Some regions of the first oxide semiconductor layer 141A and/or the second oxide semiconductor layer 151A may be treated to increase the electrical conductivity at the treated regions. When the electrical conductivity is increased at the partial region of the first oxide semiconductor layer 141A and the partial region of the second oxide semiconductor layer 151A, the corresponding regions have resistances lower than that of the oxide semiconductor to which electrical conductivity has not been given. Accordingly, when the corresponding regions come in contact with the source electrode 131A and the drain electrode 132A, contact resistances are also decreased. Therefore, the partial region of the first oxide semiconductor layer 141A and the partial region of the second oxide semiconductor layer 151A to which the electrical conductivity is given may be a region of the first oxide semiconductor layer 141A and a region of the second oxide semiconductor layer 151A that come in contact with the source electrode 131A and the drain electrode 132A.

The cross-sectional width of the first gate electrode 121A is equal to or greater than the cross-sectional width of the second active layer 150A. A channel formed by the first gate electrode 121A corresponds to a region of the first oxide semiconductor layer 141A overlapped with the first gate electrode 121A, and the source electrode 131A and the drain electrode 132A that come in contact with the first oxide semiconductor layer 141A may be formed to be closest to the region of the first oxide semiconductor layer 141A overlapped with the first gate electrode 121A. In another exemplary embodiment, when the cross-sectional width of the first gate electrode 121A is narrower than the width of the second active layer 150A, electrical conductivity may be given to a region of the first oxide semiconductor layer 141A that is not overlapped with the first gate electrode 121A.

In the thin-film transistor 100A according to the exemplary embodiment of the present invention, the source electrode 131A and the drain electrode 132A come in contact with the first oxide semiconductor layer 141A of the first active layer 140A, and the first oxide semiconductor layer 141A is overlapped with the first gate electrode 121A. Further, the source electrode 131A and the drain electrode 132A come in contact with the second oxide semiconductor layer 151A of the second active layer 150A, and the second oxide semiconductor layer 151A is overlapped with the second gate electrode 122A. Furthermore, the first gate electrode 121A and the second gate electrode 122A are electrically connected, and the same gate voltage is simultaneously applied thereto. Accordingly, when the gate voltage is applied to the first gate electrode 121A and the second gate electrode 122A to turn on the thin-film transistor 100A, the upper channel is formed at the second oxide semiconductor layer 151A of the second active layer 150A, and the lower channel is formed at the first oxide semiconductor layer 141A of the first active layer 140A. Thus, it is possible to provide the thin-film transistor 100A having a plurality of channels. Moreover, unlike a general structure of the thin-film transistor 100A in which the source electrode 131A and the drain electrode 132A come in contact only with the top portion of the oxide semiconductor layer, since the source electrode 131A and the drain electrode 132A come in contact with both the top portion and along the thickness of the second oxide semiconductor layer 151A of the second active layer 150A, an area between the source electrode 131A and the second oxide semiconductor layer 151A and an area between the drain electrode 132A and the second oxide semiconductor layer 151A increases. As a result, it is possible to enhance current flow of the thin-film transistor 100A to improve device characteristics of the thin-film transistor 100A.

Figure 1E:
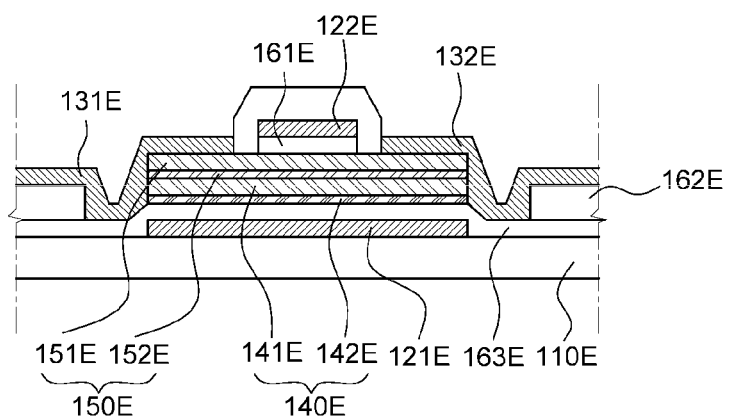
FIGS. 1E to 1I are cross-sectional views of thin-film transistors according to various exemplary embodiments of the present invention.

FIG. 1E is a cross-sectional view of a thin-film transistor according an embodiment of the present invention. Referring to FIG. 1E, a thin-film transistor 100E includes a substrate 110E, a first gate insulating layer 163E, a first gate electrode 121E, a first active layer 140E, a second active layer 150E, a second gate insulating layer 161E, a second gate electrode 122E, an interlayer insulating film 162E, a source electrode 131E, and a drain electrode 132E. The substrate 110E, the first gate insulating layer 163E, the first gate electrode 121E, the second active layer 150E, the second gate insulating layer 161E, the second gate electrode 122E and the interlayer insulating film 162E are substantially the same as the substrate 110A, the first gate insulating layer 163A, the first gate electrode 121A, the second active layer 150A, the second gate insulating layer 161A, the second gate electrode 122A and the interlayer insulating film 162A of FIG. 1B, and thus the redundant descriptions thereof is omitted.

A width of the first active layer 140E is the same as that of the second active layer 150E, and the first active layer 140E is completely overlapped with the second active layer 150E. Since the width of the first active layer 140E and the width of the second active layer 150E are the same and the first active layer 140E and the second active layer 150E are completely overlapped with each other, the source electrode 131E and the drain electrode 132E come in contact with a side portion of a first oxide semiconductor layer 141E of the first active layer 140E and a top portion and a side portion of a second oxide semiconductor layer 151E of the second active layer 150E as shown in FIG. 1E.

Figure 1F:
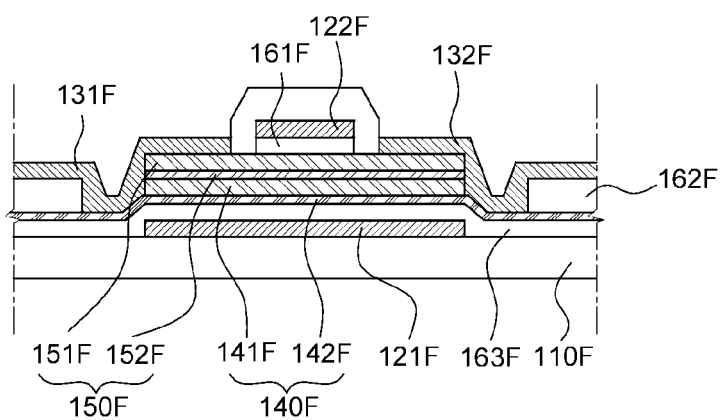

FIG. 1F is a cross-sectional view of a thin-film transistor according to an embodiment of the present invention. Referring to FIG. 1F, a thin-film transistor 100F includes a substrate 110F, a first gate insulating layer 163F, a first gate electrode 121F, a first active layer 140F, a second active layer 150F, a second gate insulating layer 161F, a second gate electrode 122F, an interlayer insulating film 162F, a source electrode 131F, and a drain electrode 132F. The substrate 110F, the first gate insulating layer 163F, the first gate electrode 121F, the second active layer 150F, the second gate insulating layer 161F, the second gate electrode 122F and the interlayer insulating film 162F are the substantially same as the substrate 110A, the first gate insulating layer 163A, the first gate electrode 121A, the second active layer 150A, the second gate insulating layer 161A, the second gate electrode 122A and the interlayer insulating film 162A of FIG. 1B, and thus the redundant descriptions thereof may not be presented.

A first oxide semiconductor layer 141F is formed on a first barrier layer 142F. A width of the first barrier layer 142F is greater than a width of the first oxide semiconductor layer 141F. For example, as shown in FIG. 1F, the width of the first oxide semiconductor layer 141F is the substantially same as that of the second active layer 150F formed on the first oxide semiconductor layer 141F, and the width of the first barrier layer 142F is greater than the width of the first oxide semiconductor layer 141F.

Figure 1G:
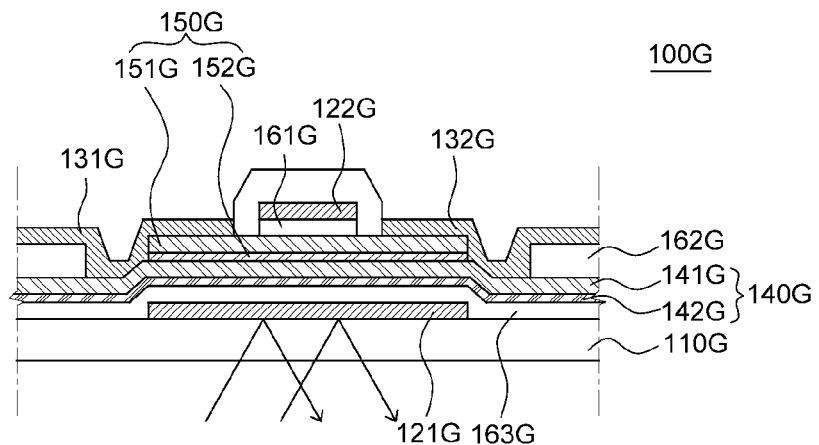

FIG. 1G is a cross-sectional view of a thin-film transistor according to an embodiment of the present invention. Referring to FIG. 1G, a thin-film transistor 100G includes a substrate 110G, a first gate insulating layer 163G, a first gate electrode 121G, a first active layer 140G, a second active layer 150G, a second gate insulating layer 161G, a second gate electrode 122G, an interlayer insulating film 162G, a source electrode 131G, and a drain electrode 132G. The substrate 110G, the first gate insulating layer 163G, the first active layer 140G, the second active layer 150G, the second gate insulating layer 161G, the second gate electrode 122G, the interlayer insulating film 162G, the source electrode 131G and the drain electrode 132G are the substantially same as the substrate 110A, the first gate insulating layer 163A, the first active layer 140A, the second active layer 150A, the second gate insulating layer 161A, the second gate electrode 122A, the interlayer insulating film 162A, the source electrode 131A and the drain electrode 132A of FIG. 1B, and thus the redundant descriptions thereof may not be presented.

The first gate electrode 121G functions as a light blocking layer. The first gate electrode 121G is formed to prevent light entering from below the substrate 100G from reaching a second oxide semiconductor layer 151G and a first oxide semiconductor layer 141G, and may be made from a reflective conductive material. When light enters the first oxide semiconductor layer 141G and the second oxide semiconductor layer 151G while a bias is applied to the thin-film transistor 100G, reliability of the thin-film transistor 100G is affected. Thus, in the thin-film transistor 100G according to the embodiment of the present invention, since the first gate electrode 121G is made from the reflective conductive material, it is possible to prevent light entering from below the substrate 100G from reaching the first oxide semiconductor layer 141G and the second oxide semiconductor layer 151G and to reduce degradation in reliability of the thin-film transistor 100G due to exposure to light. Further, in the thin-film transistor 100G according to the embodiment of the present invention, since a first barrier layer 142G and a intermediate barrier layer 152G are used as layers for alleviating the degradation of the thin-film transistor 100G by light, the first gate electrode 121G needs not be formed as thick to shield the external light as in a case where the first barrier layer 142G and the intermediate barrier layer 152G are not used.

Figure 1H:
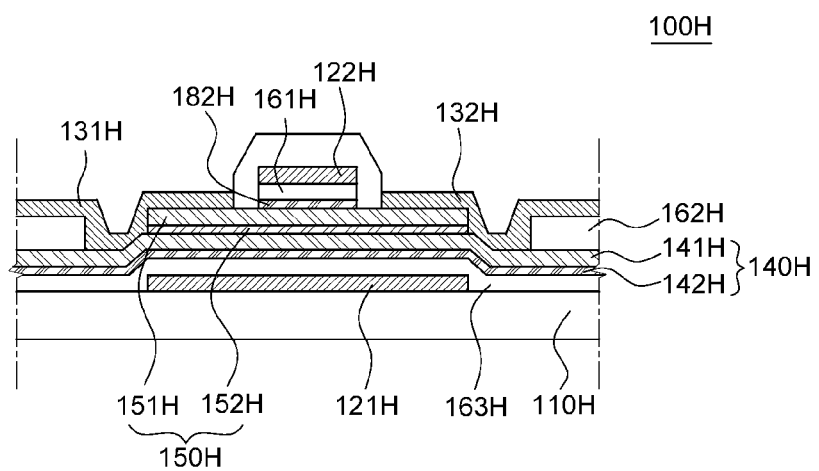

FIG. 1H is a cross-sectional view of a thin-film transistor according to an embodiment of the present invention. Referring to FIG. 1H, a thin-film transistor 100H includes a substrate 110H, a first gate insulating layer 163H, a first gate electrode 121H, a first active layer 140H, a second active layer 150H, a second barrier layer 182H, a second gate insulating layer 161H, a second gate electrode 122H, an interlayer insulating film 162H, a source electrode 131H, and a drain electrode 132H. The substrate 110H, the first gate insulating layer 163H, the first gate electrode 121H, the first active layer 140H, the second active layer 150H, the second gate insulating layer 161H, the second gate electrode 122H, the interlayer insulating film 162H, the source electrode 131H and the drain electrode 132H are the substantially same as the substrate 110A, the first gate insulating layer 163A, the first gate electrode 121A, the first active layer 140A, the second active layer 150A, the second gate insulating layer 161A, the second gate electrode 122A, the interlayer insulating film 162A, the source electrode 131A and the drain electrode 132A of FIG. 1B, and thus the redundant descriptions thereof may not be presented.

The second barrier layer 182H is a layer for reducing degradation of the thin-film transistor 100H by light and serves as a charge trapping barrier for reducing degradation of the thin-film transistor 100H due to exposure to light. The material for forming the second barrier layer 182H depends on the type of the TFT (i.e., N-type or P-type) and may be selected from the materials described above in reference to the first barrier layer 142H. Similar to the first barrier layer 142H, the material(s) and the structure of the second barrier layer 182H may be selected by considering the interface defect density between the second oxide semiconductor layer 151H and the second gate insulating layer 161H.

The width of the second barrier layer 182H needs not be as long as the width of the second oxide semiconductor layer 151H. As shown in FIG. 1H, the width of the second barrier layer 182H can be equal to the width of the second gate insulating layer 161H. Referring to FIG. 1H, the width of the second gate insulating layer 161H is the substantially same as that of the second gate electrode 122H, a width of an upper channel formed at the second oxide semiconductor layer 151H is also the substantially same as that of the second gate electrode 122H. Accordingly, since the second barrier layer 182H covers a region corresponding to the width of the upper channel to thereby effectively suppress deterioration in characteristics of the thin-film transistor 100H, the width of the second barrier layer 182H is the substantially same as that of the second gate insulating layer 161H.

Figure 1I:
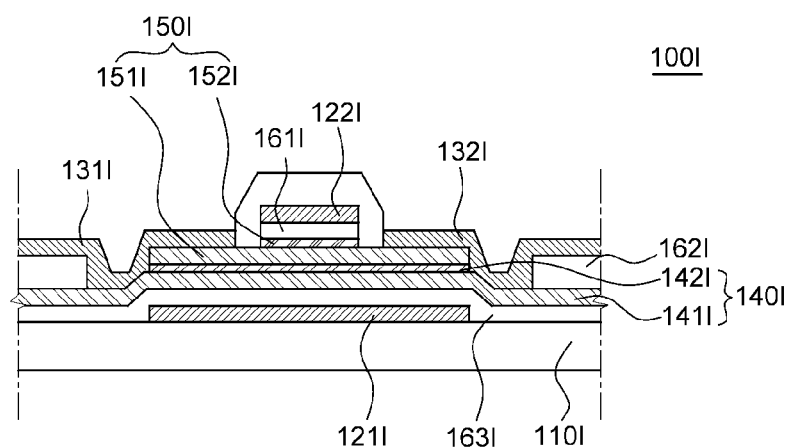

FIG. 1I is a cross-sectional view of a thin-film transistor according to an embodiment of the present invention. Referring to FIG. 1I, a thin-film transistor 100I includes a substrate 110I, a first gate insulating layer 163I, a first gate electrode 121I, a first active layer 140I, a second active layer 150I, a second gate insulating layer 161I, a second gate electrode 122I, an interlayer insulating film 162I, a source electrode 131I, and a drain electrode 132I. The substrate 110I, the first gate insulating layer 163I, the first gate electrode 121I, the second gate insulating layer 161I, the second gate electrode 122I, the interlayer insulating film 162I, the source electrode 131I and the drain electrode 132I are the substantially same as the substrate 110A, the first gate insulating layer 163A, the first gate electrode 121A, the second gate insulating layer 161A, the second gate electrode 122A, the interlayer insulating film 162A, the source electrode 131A and the drain electrode 132A of FIG. 1B, and thus the redundant descriptions thereof may not be presented.

An intermediate barrier layer 142I is formed on a first oxide semiconductor layer 141I, and a second barrier layer 152I is formed on a second oxide semiconductor layer 151I. A width of the intermediate barrier layer 142I is the same as that of the second oxide semiconductor layer 151I, and a width of the second barrier layer 152I is the same as that of the second gate insulating layer 161I.

Figure 2A:
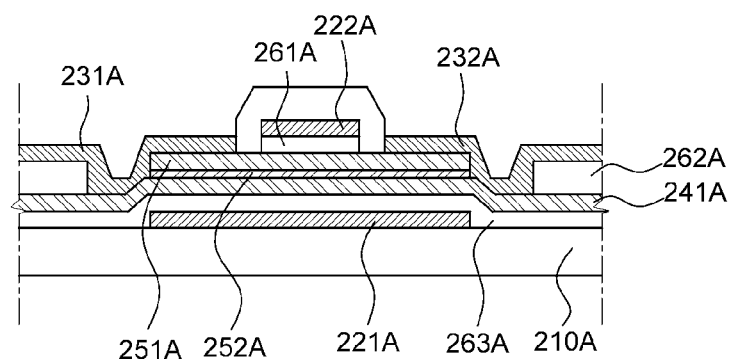
FIGS. 2A and 2B are cross-sectional views of thin-film transistors according to various exemplary embodiments of the present invention.

FIG. 2A is a cross-sectional view of a thin-film transistor according to an embodiment of the present invention. Referring to FIG. 2A, a thin-film transistor 200A includes a substrate 210A, a first gate insulating layer 263A, a first gate electrode 221A, an active structure 270A, a second gate insulating layer 261A, a second gate electrode 222A, an interlayer insulating film 262A, a source electrode 231A, and a drain electrode 232A. The substrate 210A, the first gate insulating layer 263A, the first gate electrode 221A, the second gate insulating layer 261A, the second gate electrode 222A, the interlayer insulating film 262A, the source electrode 231A and the drain electrode 232A are the substantially same as the substrate 110A, the first gate insulating layer 163A, the first gate electrode 121A, the second gate insulating layer 161A, the second gate electrode 122A, the interlayer insulating film 162A, the source electrode 131A and the drain electrode 132A of FIG. 1B, and thus the redundant descriptions thereof may not be presented.

The active structure 270A is a structure for providing channels and is formed above the first gate electrode 221A. The active structure 270A includes a first oxide semiconductor layer 241A which is formed above the first gate electrode 221A and at which a lower channel is formed, a second oxide semiconductor layer 251A that is formed above the first oxide semiconductor layer 241A and at which an upper channel is formed, and an intermediate barrier layer 252A that is formed between the first oxide semiconductor layer 241A and the second oxide semiconductor layer 251A.

The first oxide semiconductor layer 241A is formed above the first gate electrode 221A. The first oxide semiconductor layer 241A may be made from various metal materials.

The second oxide semiconductor layer 251A is formed on the intermediate barrier layer 252A. A width of the second oxide semiconductor layer 251A may be narrower than a width of the first oxide semiconductor layer 241A. The second oxide semiconductor layer 251A may be made from substantially the same material as that of the first oxide semiconductor layer 241A.

The intermediate barrier layer 252A is formed between the first oxide semiconductor layer 241A and the second oxide semiconductor layer 251A. The intermediate barrier layer 252A is a layer for insulating the first oxide semiconductor layer 241A and the second oxide semiconductor layer 251A from each other, which provide separate channels, respectively. The intermediate barrier layer 252A is a layer for reducing degradation of the thin-film transistor 200A by light, and specifically, is a layer for reducing degradation of the second oxide semiconductor layer 251A formed on the intermediate barrier layer 252A and the first oxide semiconductor layer 241A formed under the intermediate barrier layer 252A by light. The intermediate barrier layer 252A may be made from the same material as that of the intermediate barrier layer 152A of FIG. 1B.

Figure 2B:
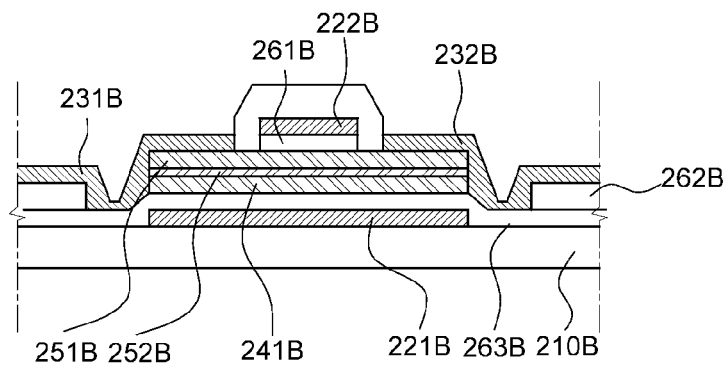

FIG. 2B is a cross-sectional view of a thin-film transistor according to an embodiment of the present invention. Referring to FIG. 2B, a thin-film transistor 200B includes a substrate 210B, a first gate insulating layer 263B, a first gate electrode 221B, an active structure 270B, a second gate insulating layer 261B, a second gate electrode 222B, an interlayer insulating film 262B, a source electrode 231B, and a drain electrode 232B. The substrate 210B, the first gate insulating layer 263B, the first gate electrode 221B, the second gate insulating layer 261B, the second gate electrode 222B, the interlayer insulating film 262B, the source electrode 231B and the drain electrode 232B are the substantially same as the substrate 210A, the first gate insulating layer 263A, the first gate electrode 221A, the second gate insulating layer 261A, the second gate electrode 222A, the interlayer insulating film 262A, the source electrode 231A and the drain electrode 232A of FIG. 2A, and thus the redundant descriptions thereof may not be presented.

A width of a first oxide semiconductor layer 241B of the active structure 270B is the same as that of a second oxide semiconductor layer 251B of the active structure 270B, and the first oxide semiconductor layer 241B and the second oxide semiconductor layer 251B are completely overlapped with each other. The source electrode 231B and the drain electrode 232B come in contact with at least one of a top portion and a side portion of the first oxide semiconductor layer 241B and at least one of a top portion and a side portion of the second oxide semiconductor layer 251B. Since the widths of the first oxide semiconductor layer 241B and the second oxide semiconductor layer 251B are the same and the first oxide semiconductor layer 241B and the second oxide semiconductor layer 251B are completely overlapped, the source electrode 231B and the drain electrode 232B come in contact with the side portion of the first oxide semiconductor layer 241B and the top portion and the side portion of the second oxide semiconductor layer 251B as shown in FIG. 2B.

Figure 3A:
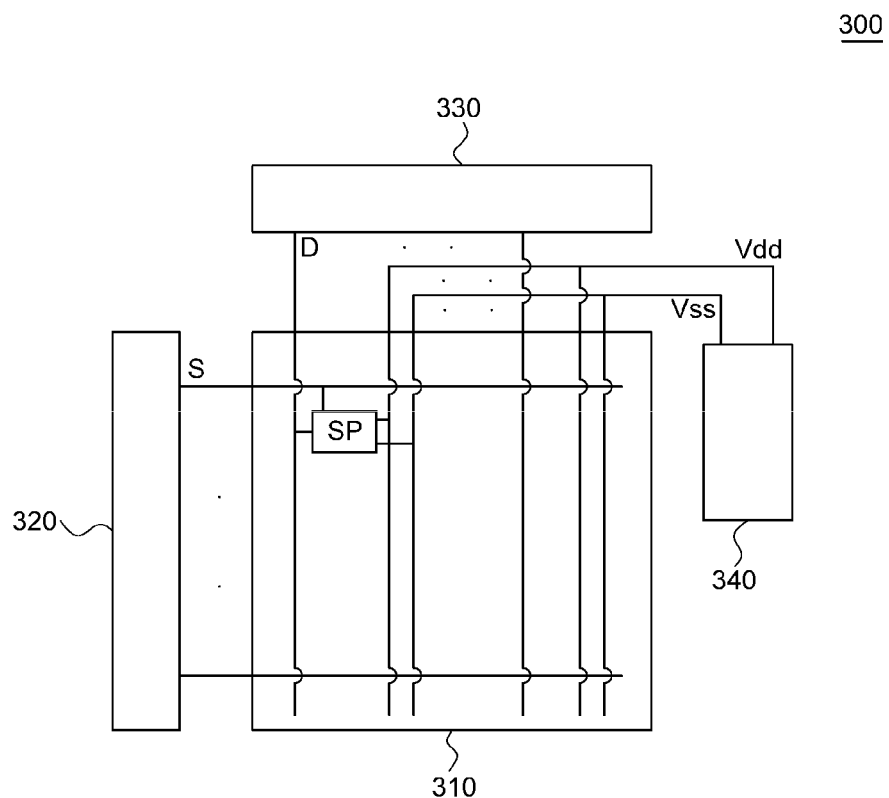
FIG. 3A is a conceptual diagram of a display device according to an exemplary embodiment of the present invention.
Figure 3B:
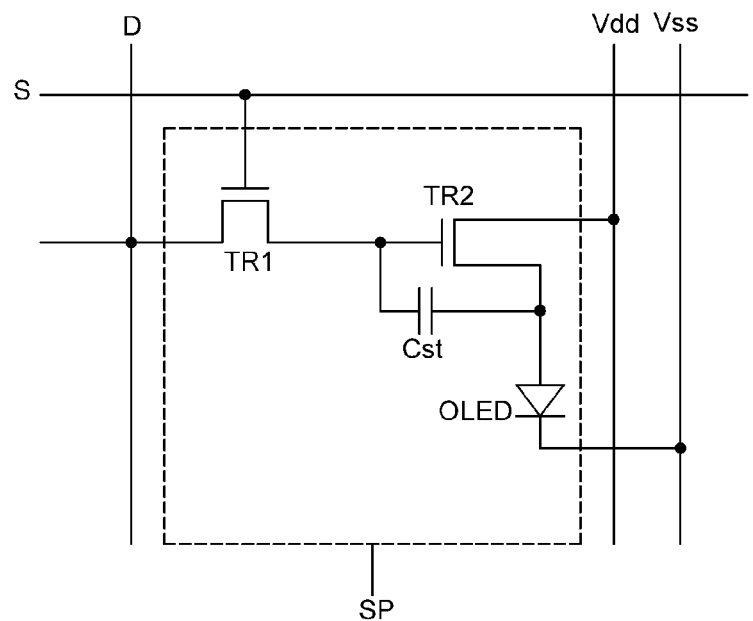
FIG. 3B is an enlarged conceptual diagram of a sub-pixel region shown in FIG. 3A.

FIG. 3A is a conceptual diagram of a display device according to an exemplary embodiment of the present invention. FIG. 3B is an enlarged conceptual diagram of a sub-pixel region shown in FIG. 3A. A display device 300 is a device for displaying an image and includes various display devices such as an organic light-emitting display (OLED) device, a liquid crystal display (LCD) device, or an electrophoretic display (EPD) device.

The display device 300 may be an organic light-emitting display device, and the organic light-emitting display device includes a substrate 310, a plurality of thin-film transistors, and an organic light-emitting diode including an anode, an organic light-emitting layer and a cathode. The plurality of thin-film transistors for emitting the organic light-emitting layer is included in a plurality of sub-pixel regions SP of the substrate 310 of the organic light-emitting display device 300. For example, as shown in FIGS. 3A and 3B, the plurality of thin-film transistors may include a switching transistor TR1 that transmits a data signal from a data driving module 330 to a gate electrode of a driving thin-film transistor TR2 when a scan signal is applied from a gate driving module 320, and the driving transistor TR2 that transmits current transmitted through a power supply module 350 to the anode in response to the data signal received from the switching transistor TR1 and controls emitting of the organic light-emitting layer of the sub-pixel or the corresponding pixel by the current transmitted to the anode. Although not illustrated in FIGS. 3A and 3B, a thin-film transistor for a compensation circuit that prevents abnormal driving of the organic light-emitting display device may be further included. The plurality of thin-film transistors of the organic light-emitting display device may be one of the thin-film transistors according to the various exemplary embodiments of the present invention.

When the organic light-emitting display device 300 is a transparent organic light-emitting display device, each of the plurality of sub-pixel regions SP of the organic light-emitting diode display device 300 includes a light-emitting region and a light-transmitting region, and the thin-film transistor and the organic light-emitting diode may be arranged in the organic light-emitting region.

As mentioned above, in the thin-film transistors according to the various exemplary embodiments of the present invention, the first gate electrode and the second gate electrode are electrically connected to each other. A connection relation of the first gate electrode and the second gate electrode will be described in more detail with reference to FIGS. 3C and 3D.

Figure 3C:
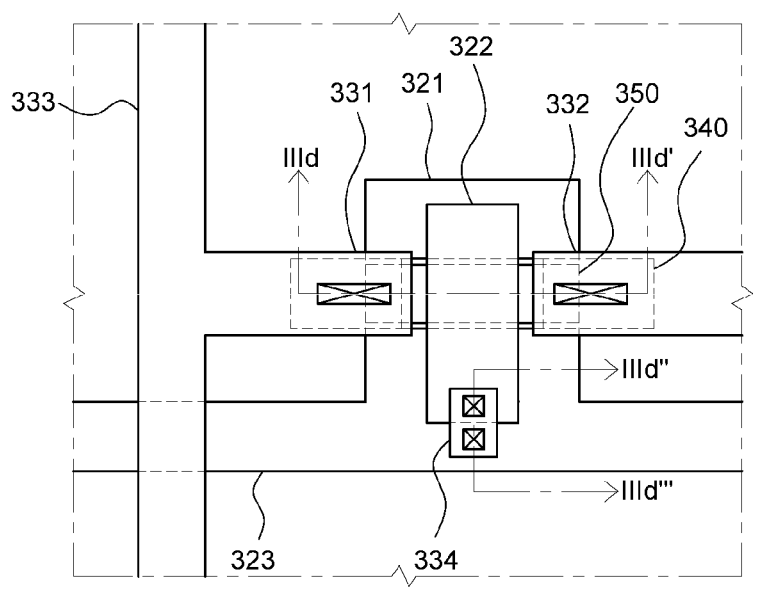
FIG. 3C is a plan view for describing the display device according to the exemplary embodiment of the present invention.
Figure 3D:
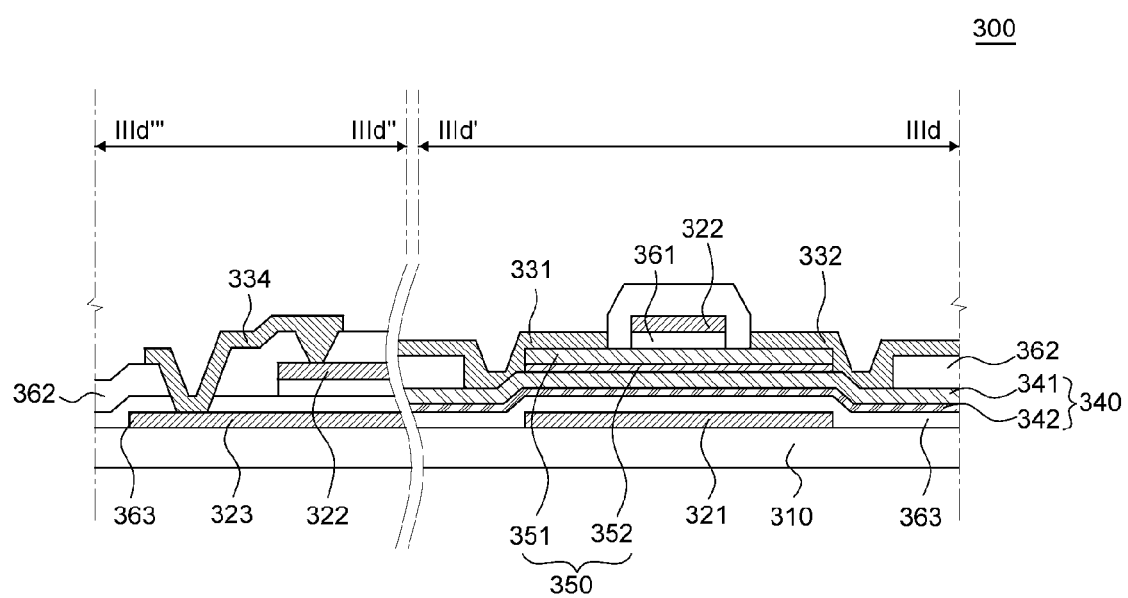
FIG. 3D is a cross-sectional view taken along lines IIId-IIId' and IIId"-IIId"' of FIG. 3C.

FIG. 3C is a plan view for describing the display device according to the exemplary embodiment of the present invention. FIG. 3D is a cross-sectional view taken along lines IIId-IIId' and IIId"-IIId'" of FIG. 3C. Referring to FIGS. 3C and 3D, the display device 300 includes a thin-film transistor including a substrate 310, a first gate insulating layer 363, a first gate electrode 321, a first active layer 340, a second active layer 350, a second gate insulating layer 361, a second gate electrode 322, an interlayer insulating film 362, a source electrode 331 and a drain electrode 332, a gate wiring 323, a data wiring 333, and a pad 334. For the sake of convenience in description, FIG. 3D illustrates the same thin-film transistor as the thin-film transistor according to the embodiment of the present shown in FIG. 1B, but is not limited thereto.

In the thin-film transistors of the displace device 300 according to the various exemplary embodiments of the present invention, the first gate electrode 321 and the second gate electrode 322 are electrically connected to each other. Referring to FIGS. 3C and 3D, the first gate electrode 321 as a lower gate electrode is branched from the gate wiring 323, and the second gate electrode 322 as an upper gate electrode is electrically connected to the gate wiring 323. Specifically, at a portion where the second gate electrode 322 and the gate wiring 323 are electrically connected (a portion of IIId"-IIId'" in FIGS. 3C and 3D), the gate wiring 323 is formed on the substrate 310, the second gate electrode 322 is formed on the second gate insulating layer 361 and the first gate insulating layer 363 formed on the gate wiring 323, and the interlayer insulating film 362 is formed on the second gate electrode 322. In order for the first gate electrode 321 and the second gate electrode 322 to be electrically connected, contact holes are formed at the interlayer insulating film 362 and the first gate insulating layer 363 on the gate wiring 323 from which the first gate electrode 321 is branched, contact holes are formed at the interlayer insulating film 362 on the second gate electrode 322, and the pad 334 is formed on the interlayer insulating film 362 at which the contact holes are formed to electrically connect the gate wiring 323 and the second gate electrode 322. In FIGS. 3C and 3D, it has been illustrated that the gate wiring 323 and the second gate electrode 322 are electrically connected through the separate pad 334, the present invention is not limited thereto. The gate wiring 323 and the second gate electrode 322 may be electrically connected in a direct contact manner. In FIGS. 3C and 3D, although it has been illustrated that the second gate electrode 322 comes in contact with the gate wiring 323 from which the first gate electrode 321 is branched, a contact position of the first gate electrode 321 and the second gate electrode 322 may be variously changed depending on designs. For example, the second gate electrode 322 may be branched from the gate wiring 323, and the first gate electrode 321 and the second gate electrode 322 may be electrically connected in such a manner that the first gate electrode 321 comes in contact with the gate wiring 323. A first gate wiring from which the first gate electrode 321 is branched and a second gate wiring from which the second gate electrode 322 is branched may be formed, and the first gate electrode 321 and the second gate electrode 322 may be electrically connected in such a manner that the first gate wiring and the second gate wiring come in contact with each other near a pixel region where the thin-film transistor is positioned or at a non-display region of the substrate 310 distanced from the pixel region.

The gate wiring 323 is connected to the gate driving module 320 to transmit a gate voltage to the first gate electrode 321 and the second gate electrode 322. That is, the gate wiring 323 may be directly connected to the gate driving module 320 to receive the gate voltage from the gate driving module 320, and the gate wiring 323 may be connected to the first gate electrode 321 and the second gate electrode 322 to apply the gate voltage thereto.

Referring again to FIGS. 3A and 3B, the display device 300 may be a liquid crystal display device, and the liquid crystal display device includes a lower substrate, an upper substrate, a pixel electrode, a common electrode, a color filter and a liquid crystal layer interposed between the upper substrate and the lower substrate. The liquid crystal display device includes a plurality of pixel regions, and includes a plurality of thin-film transistors for individually driving the plurality of pixel regions. The plurality of thin-film transistors is electrically connected to the pixel electrode formed on the lower substrate of each of the pixel regions to apply voltage to each pixel electrode, liquid crystals are oriented by an electric field generated between the pixel electrode positioned at the pixel region and the common electrode formed on the lower substrate or the upper substrate, and the oriented liquid crystals transmits selectively incident light from a separate light source. In this way, the selectively transmitted light passes through the color filter positioned on the upper substrate, so that an image is displayed. The plurality of thin-film transistors of the liquid crystal display device may be one of the thin-film transistors according to the various exemplary embodiments of the present invention.

The display device 300 may be an electrophoretic display device, and the electrophoretic display device includes a lower substrate, an upper substrate, a pixel electrode, a common electrode and an optical medium layer. The optical medium layer is interposed between the upper substrate and the lower substrate, and includes a fluid and colored charged particles dispersed in the fluid. The electrophoretic display device includes a plurality of pixel regions and a plurality of thin-film transistors for individually driving the plurality of pixel regions. The plurality of thin-film transistors is electrically connected to the pixel electrode formed on the lower substrate of each of the pixel regions to apply voltage to each pixel electrode and moves the colored charged particles by an electric field generated between the pixel electrode positioned on the pixel region and the common electrode formed on the upper substrate. The electrophoretic display device moves the colored charged particles in the aforementioned manner, and a color of the colored charged particles is displayed when the colored charged particles are positioned at a front surface of the electrophoretic display device, for example, the upper substrate. The plurality of thin-film transistors of the electrophoretic display device may be one of the thin-film transistors according to the various exemplary embodiments of the present invention.

When the thin-film transistors according to the various exemplary embodiments of the present invention are used in the display device 300, a design of the thin-film transistor may be partially changed depending on a kind of the display device 300. For example, when the display device 300 is a flexible display device, since the display device 300 needs to be repeatedly bent or folded, various elements constituting the thin-film transistor need to be easily bent or folded. Moreover, when the display device 300 is a transparent display device, even though the display device 300 is viewed from one side, the other side of the display device needs to be viewed to some extent. Accordingly, the various elements constituting the thin-film transistor may be considerably decreased in size, or may be made from transparent materials.

When the thin-film transistors according to the various exemplary embodiments of the present invention are used in the display device 300, a design of the thin-film transistor may be partially changed depending on an article in which the display device 300 is provided. For example, when the display device 300 is provided in a mobile device or a small-sized device such as a cellular phone, a smart phone, a tablet PC, or a PDA, since a built-in battery is used without using an external power supply, the elements of the thin-film transistor may be designed to be suitable for the limited capacity of the battery. Further, when the display device 300 is provided in a fixation device or a large-sized device such as a television, a monitor, a screen, or a billboard, since a power is supplied from an external power supply, the elements of the thin-film transistor may be designed so as to realize higher definition of the display device 300 due to a stabilized power supply.

When the thin-film transistors according to the various exemplary embodiments of the present invention are used in the display device 300, a design of the thin-film transistor may be partially changed depending on a place in which the display device 300 is provided. For example, when the display device 300 is provided at a high-humidity place such as a toilet, a basin, a shower room, or a kitchen, the thin-film transistor may be designed using moisture-resistance elements. Furthermore, when the display device 300 is provided at a place that is easily exposed to external impact, such as an external wall of a building, a window glass of a building or a window glass of a vehicle, the thin-film transistor may be designed using elements that easily absorb impact or have impact resistance.

The thin-film transistors according to the various exemplary embodiments of the present invention are not limited to the aforementioned various modifications, and may be applied to various applications. The designs of thin-film transistors may be changed in various manners depending on the applied applications.

Figure 4:
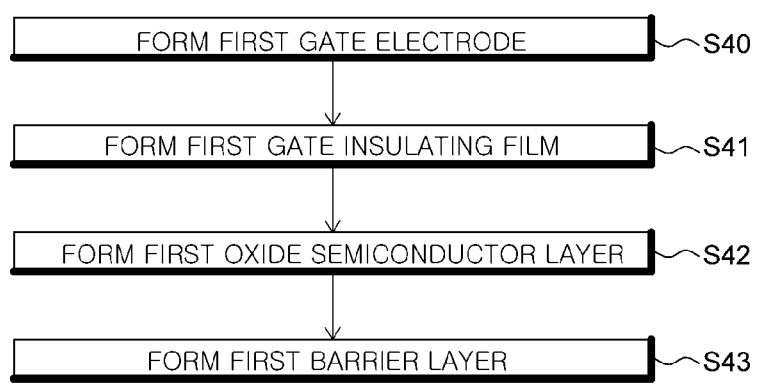
FIG. 4 is a flowchart for describing a method for manufacturing a thin-film transistor according to an exemplary embodiment of the present invention.

FIG. 4 is a flowchart for describing a method for manufacturing a thin-film transistor according to an exemplary embodiment of the present invention. FIGS. 5A to 5D are cross-sectional views of processes for describing the method for manufacturing a thin-film transistor according to the exemplary embodiment of the present invention.

First, a first gate electrode is formed (S40) on a substrate. Then a first gate insulating layer is formed (S41) on the first gate electrode. The process of forming the first gate insulating layer is described in more detail with reference to FIG. 5A.

Figure 5A:
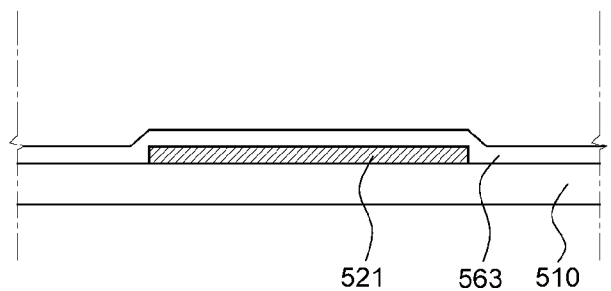
FIGS. 5A to 5D are cross-sectional views of processes for describing the method for manufacturing a thin-film transistor according to the exemplary embodiment of the present invention.
Figure 5B:
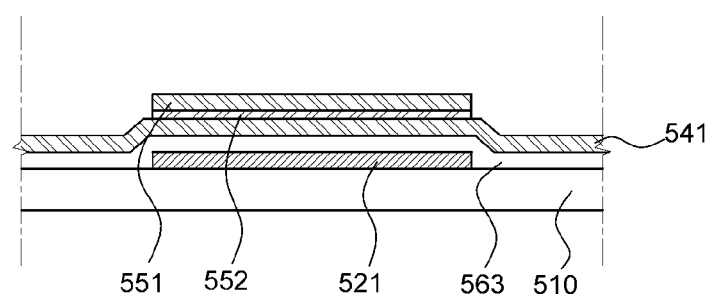

Referring to FIG. 5A, a first gate electrode 521 is formed on a substrate 510. The forming of the first gate electrode 521 may include forming a metal material for a gate electrode 521 on the entire surface of the substrate 510 and selectively patterning the metal material for a gate electrode 521 by, for example, a photolithography process. Subsequently, a first gate insulating layer 563 is formed on the substrate 510 on which the first gate electrode 521 is formed. The first gate insulating layer 563 is formed to cover the first gate electrode 521 on the substrate 510.

A first oxide semiconductor layer as a first active layer is formed (S42) on the first gate insulating layer, an intermediate barrier layer is formed on the first oxide semiconductor layer, and a second oxide semiconductor layer is formed on the intermediate barrier layer. Processes of forming the first oxide semiconductor layer, the intermediate barrier layer and the second oxide semiconductor layer are described in more detail with reference to FIG. 5B.

A first barrier layer is formed (S43). As described below, the first barrier layer may be formed on the first oxide semiconductor layer 541. However, the first barrier layer may be formed on the first gate insulating layer 563.

In order to form a second oxide semiconductor layer 551 and an intermediate barrier layer (i.e., first barrier) 552, a material for a second oxide semiconductor layer 551 and a material for an intermediate barrier layer 552 may be formed on a first oxide semiconductor layer 541, and the material for a second oxide semiconductor layer 551 and the material for a intermediate barrier layer 552 are patterned.

Subsequently, a second gate insulating layer is formed on the second oxide semiconductor layer, and a second gate electrode is formed on the second gate insulating layer.

Figure 5C:
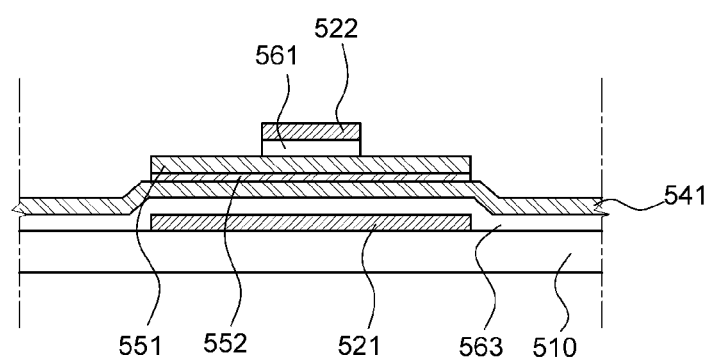

Referring to FIG. 5C, a second gate insulating layer 561 and a second gate electrode 522 are formed on partial regions of the second oxide semiconductor layer 551. The forming of the second gate insulating layer 561 and the second gate electrode 522 may include forming a material for a second gate insulating layer 561 and a material for a second gate electrode 522 on the entire surface of the substrate 510 and selectively patterning the material for a second gate insulating layer 561 and the material for a second gate electrode 522 by, for example, a photolithography process.

Furthermore, although not illustrated in FIG. 5C, a second barrier layer may be formed on the second active layer 550. The second barrier layer may be made from the same that of the first barrier layer 542 or the intermediate barrier layer 552, and a width of the second barrier layer may be the substantially same as that of the second gate electrode 522.

In some exemplary embodiments, electrical conductivity may be given to a partial region of the first active layer 540 and a partial region of the second active layer 550. The giving of the electrical conductivity to the partial region of the first active layer 540 and the partial region of the second active layer 550 may include giving electrical conductivity to the partial region of the first active layer 540 and the partial region of the second active layer 550 by using the second gate electrode 522 and the second gate insulating layer 561 as masks. The giving of the electrical conductivity to the partial region of the first active layer 540 and the partial region of the second active layer 550 is performed to reduce resistances of the partial region of the first active layer 540 and the partial region of the second active layer 550 in contact with a source electrode 531 and a drain electrode 532.

Thereafter, the interlayer insulating film is formed on the second gate electrode, the first oxide semiconductor layer and the second oxide semiconductor layer, and a source electrode and a drain electrode that are electrically connected to the first oxide semiconductor layer and the second oxide semiconductor layer are formed. A process of forming the interlayer insulating film and a process of forming the source electrode and the drain electrode are explained in more detail with reference to FIG. 5D.

Figure 5D:
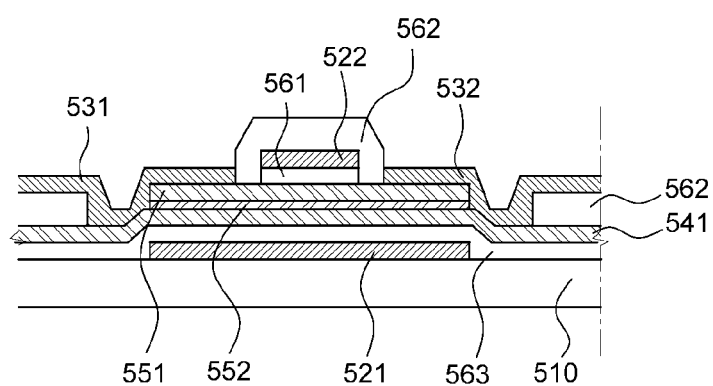

Referring to FIG. 5D, the forming of an interlayer insulating film 562 may include forming contact holes for opening a partial region of the first active layer 540 and a partial region of the second active layer 550 by forming a material for an interlayer insulating film 562 over the entire surface of the substrate 510 on which the gate electrode is formed and selectively patterning the material for an interlayer insulating film 562 by a photolithograph process. After the interlayer insulating film 562 including the contact holes is formed, the source electrode 531 and the drain electrode 532 that are electrically connected to the first oxide semiconductor layer 541 and the second oxide semiconductor layer 551 may be formed.

The exemplary embodiments of the present invention have been described in more detail with reference to the accompanying drawings, but the present invention is not limited to the exemplary embodiments. It will be apparent to those skilled in the art that various modifications can be made without departing from the technical sprit of the invention. Accordingly, the exemplary embodiments disclosed in the present invention are used not to limit but to describe the technical spirit of the present invention, and the technical spirit of the present invention is not limited to the exemplary embodiments. Therefore, the exemplary embodiments described above are considered in all respects to be illustrative and not restrictive. The protection scope of the present invention must be interpreted by the appended claims and it should be interpreted that all technical spirits within a scope equivalent thereto are included in the appended claims of the present invention.

What is claimed is:

1. A thin-film transistor, comprising:
   a first gate electrode;
   a first gate insulating layer on the first gate electrode;
   a first oxide semiconductor layer and a second oxide semiconductor layer on the first gate insulating layer, the first and second oxide semiconductor layers providing a lower channel and an upper channel, respectively, wherein the second oxide semiconductor layer has a smaller area than an area of the first oxide semiconductor layer to enhance current flow of the thin-film transistor;
   an intermediate barrier layer separating the first and second oxide semiconductor layers, the intermediate barrier layer forming a charge trapping barrier obstructing a transport of charge between the first and second oxide semiconductor layers, wherein the intermediate barrier layer has a maximum valence band value (Vmax) lower than a maximum valence band value (Vmax) of the first and second oxide semiconductor layers to prevent holes or electrons in the first and second oxide semiconductor layers from being trapped to the first gate insulating layer;
   a second gate insulating layer on the second oxide semiconductor layer having a same width as that of the second oxide semiconductor layer comprising a smaller area than an area of the first oxide semiconductor layer;
   a second gate electrode on the second gate insulating layer, the second gate electrode electrically connected to the first gate electrode;
   a source electrode electrically connected to the first and second oxide semiconductor layers; and
   a drain electrode electrically connected to the first and second oxide semiconductor layers.

2. The thin-film transistor of claim 1, wherein the first oxide semiconductor layer is controlled by a first voltage applied to the first gate electrode and the second oxide semiconductor layer is controlled by a second voltage applied to the second gate electrode.

3. The thin-film transistor of claim 2, wherein the first and second voltages are identical.

4. The thin-film transistor of claim 1, wherein the intermediate barrier layer has a maximum conduction band value (Cmax) greater than the maximum conduction band value (Cmax) of first and second oxide semiconductor layers when the thin-film transistor is a P-type thin-film transistor.

5. The thin-film transistor of claim 1, wherein the first oxide semiconductor layer has a cross-sectional width equal to or greater than that of the second oxide semiconductor layer, and wherein the source and drain electrodes are in direct contact with the first and second oxide semiconductor layers.

6. The thin-film transistor of claim 1, further comprising at least one of:
   a first barrier layer interposed between the first gate insulating layer and the first oxide semiconductor layer; and
   a second barrier layer interposed between the second gate insulating layer and the second oxide semiconductor layer.

7. The thin-film transistor of claim 6, wherein the first barrier layer has a maximum valence band value (Vmax) lower than that of the first oxide semiconductor layer and the first gate insulating layer when the thin-film transistor is an N-type thin-film transistor, and wherein the first barrier layer has a maximum conduction band value (Cmax) greater than that of the first oxide semiconductor layer and the first gate insulating layer when the thin-film transistor is a P-type thin-film transistor.

8. The thin-film transistor of claim 6, wherein the second barrier layer has a maximum valence band value (Vmax) lower than that of the second oxide semiconductor layer and the second gate insulating layer when the thin-film transistor is an N-type thin-film transistor, and wherein the second barrier layer has a maximum conduction band value (Cmax) greater than that of the second oxide semiconductor layer and the second gate insulating layer when the thin-film transistor is a P-type thin-film transistor.

9. The thin-film transistor of claim 1, wherein the first gate electrode is made of a reflective conductive material.

10. The thin-film transistor of claim 1, wherein, when the thin-film transistor is an N-type thin-film transistor, the intermediate barrier layer includes at least one of a TiOx, TaOx, $SrTiO_3$, $BaZrO_3$, $ZrO_2$, $HfO_2$, $Al_2O_3$, MgO, $Ga_2O_3$, and wherein, when the thin-film transistor is an P-type thin-film transistor, the intermediate barrier layer includes at least one of $Cu_2O$, $CuAlO_2$, $SiO_2$, $SrCu_2O_2$, $Al_2O_3$.

11. A method for manufacturing a thin-film transistor, the method comprising: forming a first gate electrode on a substrate:
   forming a first gate insulating layer on the first gate electrode;
   forming a first oxide semiconductor layer and a second oxide semiconductor layer on the first gate insulating layer, the first and second oxide semiconductor layers providing a lower channel and an upper channel, respectively, wherein the second oxide semiconductor layer has a smaller area than an area of the first oxide semiconductor layer to enhance current flow of the thin-film transistor;
   forming an intermediate barrier layer for separating the first and second oxide semiconductor layers, the intermediate barrier layer having a charge trapping barrier for obstructing a transport of charge between the first and second oxide semiconductor layers, wherein the intermediate barrier layer has a maximum valence band value (Vmax) lower than a maximum valence band value (Vmax) of the first and second oxide semiconductor layers to prevent holes or electrons in the first and second oxide semiconductor layers from being trapped to the first gate insulating layer;

forming a second gate insulating layer on the second oxide semiconductor layer having a same width as that of the second oxide semiconductor layer comprising a smaller area than an area of the first oxide semiconductor layer;

forming a second gate electrode on the second gate insulating layer, the second gate electrode electrically connected to the first gate electrode;

forming a source electrode electrically connected to the first and second oxide semiconductor layers; and forming a drain electrode electrically connected to the first and second oxide semiconductor layers.

12. The method of claim 11, wherein the first oxide semiconductor layer is controlled by a first voltage applied to the first gate electrode and the second oxide semiconductor layer is controlled by a second voltage applied to the second gate electrode.

13. The method of claim 12, wherein the first and second voltages are identical.

14. The method of claim 11, wherein the intermediate barrier layer has a maximum conduction band value (Cmax) greater than the maximum conduction band value (Cmax) of first and second oxide semiconductor layers when the thin-film transistor is a P-type thin-film transistor.

15. The method of claim 11, wherein the first oxide semiconductor layer has a cross-sectional width equal to or greater than that of the second oxide semiconductor layer, and wherein the source and drain electrodes are in direct contact with the first and second oxide semiconductor layers.

16. The method of claim 11, further comprising:
forming a first barrier layer interposed between the first gate insulating layer and the first oxide semiconductor layer; and
forming a second barrier layer interposed between the second gate insulating layer and the second oxide semiconductor layer.

17. The method of claim 16, wherein the first barrier layer has a maximum valence band value (Vmax) lower than that of the first oxide semiconductor layer and the first gate insulating layer when the thin-film transistor is an N-type thin-film transistor, and wherein the first barrier layer has a maximum conduction band value (Cmax) greater than that of the first oxide semiconductor layer and the first gate insulating layer when the thin-film transistor is a P-type thin-film transistor.

18. The method of claim 16, wherein the second barrier layer has a maximum valence band value (Vmax) lower than that of the second oxide semiconductor layer and the second gate insulating layer when the thin-film transistor is an N-type thin-film transistor, and wherein the second barrier layer has a maximum conduction band value (Cmax) greater than that of the second oxide semiconductor layer and the second. gate insulating layer when the thin-film transistor is a P-type thin-film transistor.

19. The method of claim 11, wherein the first gate electrode is made of a reflective conductive material.

20. The method of claim 11, wherein, when the thin-film transistor is an N-type thin-film transistor, the intermediate barrier layer includes at least one of a TiOx, TaOx, $SrTiO_3$, $BaZrO_3$, $ZrO_2$, $HfO_2$, $Al_2O_3$, MgO, $Ga_2O_3$, and wherein, when the thin-film transistor is an P-type thin-film transistor, the intermediate barrier layer includes at least one of $Cu_2O$, $CuAlO_2$, $SiO_2$, $SrCu_2O_2$, $Al_2O_3$.

* * * * *